United States Patent [19]
Mannoh et al.

[11] Patent Number: 5,345,463
[45] Date of Patent: Sep. 6, 1994

[54] SEMICONDUCTOR LASER WITH IMPROVED OSCILLATION WAVELENGTH REPRODUCIBILITY

[75] Inventors: Masaya Mannoh, Hirakata; Kiyoshi Ohnaka, Moriguchi, both of Japan

[73] Assignee: Matsushita Electric Industrial Co., Ltd., Osaka, Japan

[21] Appl. No.: 45,423

[22] Filed: Apr. 13, 1993

[30] Foreign Application Priority Data

Apr. 14, 1992 [JP] Japan ................................. 4-094239

[51] Int. Cl.$^5$ ............................................. H01S 3/19
[52] U.S. Cl. ......................................... 372/45; 372/46
[58] Field of Search ............................. 372/45, 46, 44

[56] References Cited

U.S. PATENT DOCUMENTS 5,177,757  1/1993  Tsugami ................................. 372/45

FOREIGN PATENT DOCUMENTS 61-137384  6/1986  Japan .
1175279  7/1989  Japan .

*Primary Examiner*—James W. Davie
*Attorney, Agent, or Firm*—Spencer, Frank & Schneider

[57] ABSTRACT

A lateral mode control type of semiconductor laser has a high-yield structure having a long life and improved oscillation wavelength reproducibility. A diffusion limit layer formed of an undoped $Ga_{0.5}In_{0.5}P$ layer and an undoped $(Al_{0.6}Ga_{0.4})_{0.5}In_{0.5}P$ layer is provided between a p-$(Al_{0.6}Ga_{0.4})_{0.5}In_{0.5}P$ clad layer and an undoped $Ga_{0.5}In_{0.5}P$ active layer. The diffusion limit layer has a diffusion coefficient smaller than that of the clad layer. Impurity Zn diffused from the p-$(Al_{0.6}Ga_{0.4})_{0.5}In_{0.5}P$ clad layer during crystal growth or working is trapped in the undoped $Ga_{0.5}In_{0.5}P$ layer almost entirely. A part of the impurity Zn diffuses in the undoped $(Al_{0.6}Ga_{0.4})_{0.5}In_{0.5}P$ layer thereunder but does not reach the undoped $Ga_{0.5}In_{0.5}P$ active layer.

2 Claims, 2 Drawing Sheets

SEMICONDUCTOR LASER WITH IMPROVED OSCILLATION WAVELENGTH REPRODUCIBILITY

BACKGROUND OF THE INVENTION

1. Field of the Invention

This invention relates to a lateral mode control type of AlGaInP semiconductor laser capable of being used for light communication, optical erasure, recording and reproduction of information, and the like.

2. Description of the Related Art

Semiconductor lasers have gained in importance as a light source for information processing units using optical disks or the like. In particular, AlGaInP semiconductor lasers of a 600 nm wavelength band have attracted attention, and the development of such lasers is being promoted.

Conventional AlGaInP semiconductor lasers have a structure such as that illustrated in section in FIG. 3. Such a device structure is ordinarily formed by a process described below in accordance with a crystal growth method such as a metal organic vapor phase epitaxy (MOVPE) method.

In a first crystal growth step, a Se-doped n-$(Al_{0.6}Ga_{0.4})_{0.5}In_{0.5}P$ clad layer 2, an undoped $Ga_{0.5}In_{0.5}P$ active layer 3, a Zn-doped p-$(Al_{0.6}Ga_{0.4})_{0.5}In_{0.5}P$ clad layer 40, a Zn-doped p-GaAs cap layer (not shown) are successively laminated on an n-GaAs substrate 1.

Next, the Zn-doped p-$(Al_{0.6}Ga_{0.4})_{0.5}In_{0.5}P$ clad layer 40 is etched by using an $SiO_2$ mask (not shown) so that an unetched portion has a trapezoidal cross section, thereby forming a mesa stripe in the $<1\bar{1}0>$ direction. Thereafter, in a second crystal growth step, an n-GaAs current stricture layer 5 is embedded in side surfaces of the mesa stripe by being selectively grown.

Then, the $SiO_2$ mask (not shown) is removed and, in a third crystal growth step, a p-GaAs contact layer 6 is laminated over the entire surface. Finally, a p side electrode 7 and an n side electrode 8 are formed.

In a semiconductor laser having this device structure, current-stricture can be effected by the n-GaAs current stricture layer 5. Also, laser light is guided by being confined under the mesa stripe. A lateral waveguide structure is formed in this manner.

The above-described conventional device structure, however, entails problems described below.

A phenomenon is inevitable that impurities, such as Se and Zn added in n- and p-$(Al_{0.6}Ga_{0.4})_{0.5}In_{0.5}P$ clad layers 2 and 40, diffuse in a crystal during crystal growth or during a heat treatment. The influence of this phenomenon is serious particularly in a case where a plurality of crystal growth steps such as those mentioned above are required. It is thereby possible that a PN junction position is changed and impurities diffused in undoped $Ga_{0.5}In_{0.5}P$ active layer 3 generate nonemissive recombination centers in the active layer, thereby deteriorating device characteristics.

In a material such as an AlGaInP material forming a crystal in which an orderly structure called a natural super lattice is formed, disordering of the natural super lattice is promoted as impurities such as Se and Zn are diffused, and a band gap of the crystal is changed according to the extent of diffusion. That is, impurities added in n- and p-$(Al_{0.6}Ga_{0.4})_{0.5}In_{0.5}P$ clad layers 2 and 40 are diffused in undoped $Ga_{0.5}In_{0.5}P$ active layer 3 to change a band gap thereof. This effect is increased if the impurity concentration is higher. This phenomenon has restricted the improvement in the oscillation wavelength reproducibility of semiconductor lasers.

SUMMARY OF THE INVENTION

An object of the present invention is to provide a lateral mode control type of semiconductor laser having a high-yield device structure having a long life and improved oscillation wavelength reproducibility.

To achieve this object, according to one aspect of the present invention, there is provided a semiconductor laser comprising an undoped or low-doped AlGaInP layer formed between at least one of $(Al_XGa_{1-X})InP$ clad layers and an $(Al_YGa_{1-Y})InP$ active layer.

In this semiconductor laser, an undoped $(Al_ZGa_{Z-})InP$ layer is formed between an $(Al_XGa_{1-X})InP$ clad layer and an $(Al_YGa_{1-Y})InP$ active layer. Diffusion of an impurity into the $(Al_YGa_{1-Y})InP$ active layer can be thereby avoided. Accordingly, there is no risk of a characteristic deterioration or a variation in oscillation wavelength caused by impurity diffusion in the $(Al_YGa_{1-Y})InP$ active layer. It is therefore possible to obtain a high-yield semiconductor laser having a long life and improved oscillation wavelength reproducibility.

According to another aspect of the present invention, there is provided a semiconductor laser comprising a single-layer or multi-layer diffusion limit layer formed between at least one of $(Al_XGa_{1-X})InP$ clad layers and an $(Al_YGa_{1-Y})InP$ active layer, the diffusion limit layer including an AlGaInP layer having an impurity diffusion coefficient smaller than that of the $(Al_XGa_{1-X})InP$ clad layer.

In this semiconductor laser, at least one of the diffusion limit layers including an AlGaInP layer having a small impurity diffusion coefficient is formed between an $(Al_XGa_{1-X})InP$ clad layer and an $(Al_YGa_{1-Y})InP$ active layer, whereby the diffusion speed can be reduced and the diffusion of an impurity into the $(Al_YGa_{1-Y})InP$ active layer can be avoided. Therefore, there is no risk of a characteristic deterioration or a variation in oscillation wavelength caused by impurity diffusion into the $(Al_YGa_{1-Y})InP$ active layer, and it is possible to obtain a high-yield semiconductor laser having a long life and improved oscillation wavelength reproducibility.

DESCRIPTION OF THE PREFERRED EMBODIMENTS

Embodiments of the present invention will be described below with reference to the drawings.

FIRST EMBODIMENT

Figure 1:
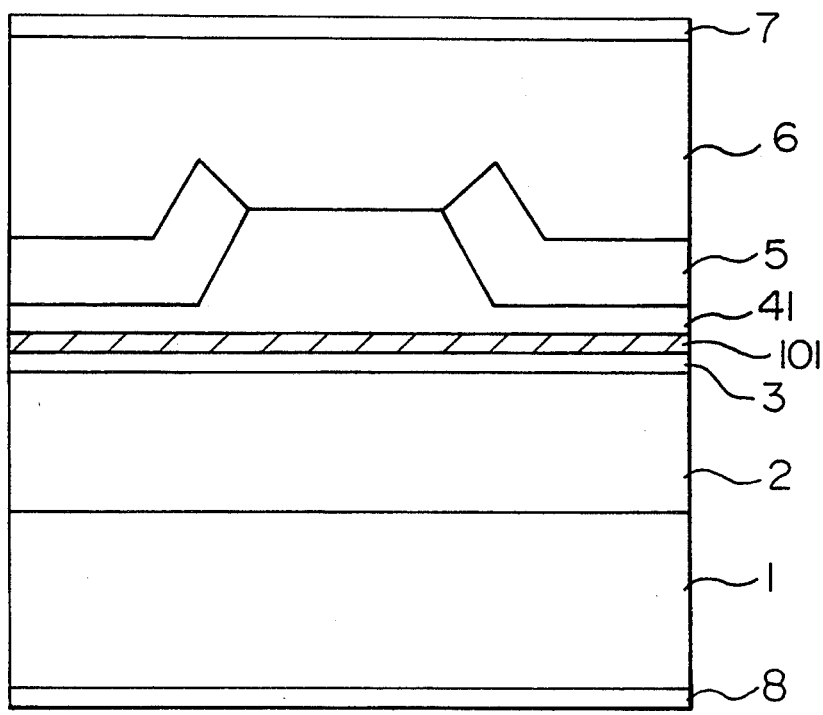
FIG. 1 is cross-sectional view of the device structure of a semiconductor laser in accordance with a first embodiment of the present invention.

FIG. 1 is a cross-sectional view of the device structure of a lateral mode control type semiconductor laser in accordance with a first embodiment of the present invention. As illustrated, the semiconductor laser has a lattice-adjusted n-GaAs substrate 1, an n-$(Al_{0.6}Ga_{0.4})_{0.5}In_{0.5}P$ clad layer 2 (1.0 $\mu$m), an undoped $Ga_{0.5}In_{0.5}P$ active layer 3 (60 nm), an undoped $(Al_{0.6}Ga_{0.4})_{0.5}In_{0.5}P$ layer 101 (10 nm), a p-$(Al_{0.6}Ga_{0.4})_{0.5}In_{0.5}P$ clad layer 41 (1.0 μm), a p-GaAs contact layer 6 (3.0 μm), an n-GaAs current stricture layer 5 (0.5 mm), and p side and n side electrodes 7 and 8.

This device structure of the semiconductor laser was formed on a (100) n-GaAs substrate by a low pressure MOVPE method at a growing temperature of 750° C. and a growing pressure of 50 Torr, as described below. As raw-material gas, trimethyl gallium (TMG), trimethyl alminum (TMA), trimethyl indium (TMI), arsine ($AsH_3$), and phosphine ($PH_3$) are used. As dopant gas, hydrogen selenide ($H_2Se$) and dimethylzinc (DMZ) are used.

In a first crystal growth step, n-$(Al_{0.6}Ga_{0.4})_{0.5}In_{0.5}P$ clad layer 2, undoped $Ga_{0.5}In_{0.5}P$ active layer 3, undoped $(Al_{0.6}Ga_{0.4})_{0.5}In_{0.5}P$ layer 101, p-$(Al_{0.6}Ga_{0.4})_{0.5}In_{0.5}P$ clad layer 41 and a p-GaAs cap layer (not shown) are successively laminated on n-GaAs substrate 1.

Next, p-$(Al_{0.6}Ga_{0.4})_{0.5}In_{0.5}P$ clad layer 41 is etched by using an $SiO_2$ mask (not shown) so that an unetched portion has a trapezoidal cross section, thereby forming a mesa stripe in the $<1\bar{1}0>$ direction. Thereafter, in a second crystal growth step, n-GaAs current stricture layer 5 is embedded in side surfaces of the mesa stripe by being selectively grown.

Next, the $SiO_2$ mask (not shown) is removed and, in a third crystal growth step, p-GaAs contact layer 6 is laminated over the entire surface. Finally, p side electrode 7 and n side electrode 8 are formed.

A semiconductor laser of the conventional semiconductor laser structure having no undoped $(Al_{0.6}Ga_{0.4})_{0.5}In_{0.5}P$ layer 101 inserted was deteriorated in about 2,000 hours by operating with an oscillation wavelength of 676 nm in a 50° C., 5 mW continuous energization test. In contrast, stable operation for 10,000 hours or longer was confirmed with respect to the semiconductor laser of this embodiment operating with an oscillation wavelength of 680 nm in a 50° C., 5 mW continuous energization test.

The semiconductor laser of this embodiment and the conventional semiconductor laser were examined by SIMS analysis with respect to a light emitting portion. In the conventional semiconductor laser, a diffusion front of Zn, which is a p type impurity, was within the active layer. It is known that if diffusion of an impurity occurs in a crystal, a natural super lattice is disordered so that a band gap changes. That is, it is thought that, in the conventional semiconductor laser, a band gap change is caused in the active layer in-plane and thickness directions to change photon energy determining a gain peak and, hence, a change in corresponding oscillation wavelength. In such a case, diffused Zn causes generation of a defect which forms a non-emissive center in the active layer, resulting in a reduction in reliability. In contrast, in the case of this embodiment, a diffusion front of Zn, which is a p type impurity, is within the undoped $(Al_{0.6}Ga_{0.4})_{0.5}In_{0.5}P$ layer 101.

In accordance with this embodiment, as described above, the undoped $(Al_{0.6}Ga_{0.4})_{0.5}In_{0.5}P$ layer 101 is formed between the p-$(Al_{0.6}Ga_{0.4})_{0.5}In_{0.5}P$ clad layer 41 and the undoped $Ga_{0.5}In_{0.5}P$ active layer 3. Therefore, impurity Zn diffused from the p-$(Al_{0.6}Ga_{0.4})_{0.5}In_{0.5}P$ clad layer 41 during crystal growth or working diffuses in the undoped $(Al_{0.6}Ga_{0.4})_{0.5}In_{0.5}P$ layer 101 but cannot reach the undoped $Ga_{0.5}In_{0.5}P$ active layer 3. Accordingly, there is no risk of a characteristic deterioration or a variation in oscillation wavelength caused by impurity diffusion in the undoped $Ga_{0.5}In_{0.5}P$ active layer 3. It is therefore possible to obtain a high-yield semiconductor laser having a long life and improved oscillation wavelength reproducibility.

A low-doped AlGaInP layer may be used instead of the undoped $(Al_{0.6}Ga_{0.4})_{0.5}In_{0.5}P$ layer 101.

A similar effect may be achieved by providing an undoped or low-doped AlGaInP layer under the undoped $Ga_{0.5}In_{0.5}P$ active layer 3 (i.e., between the n-$(Al_{0.6}Ga_{0.4})_{0.5}In_{0.5}P$ clad layer 2 and the undoped $Ga_{0.5}In_{0.5}P$ active layer 3) instead of providing undoped $(Al_{0.6}Ga_{0.4})_{0.5}In_{0.5}P$ layer 101 over the undoped $Ga_{0.5}In_{0.5}P$ active layer 3. If undoped or low-doped AlGaInP layers are provided over and under the active layer 3, a further improved effect can be achieved.

SECOND EMBODIMENT

Figure 2:
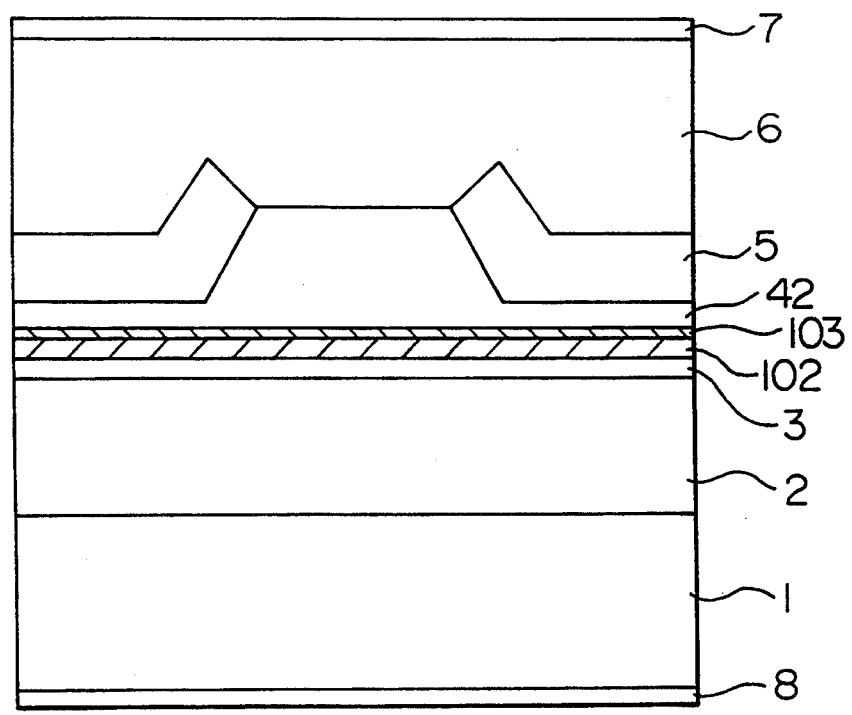
FIG. 2 is a cross-sectional view of the device structure of a semiconductor laser in accordance with a second embodiment of the present invention.
Figure 3:
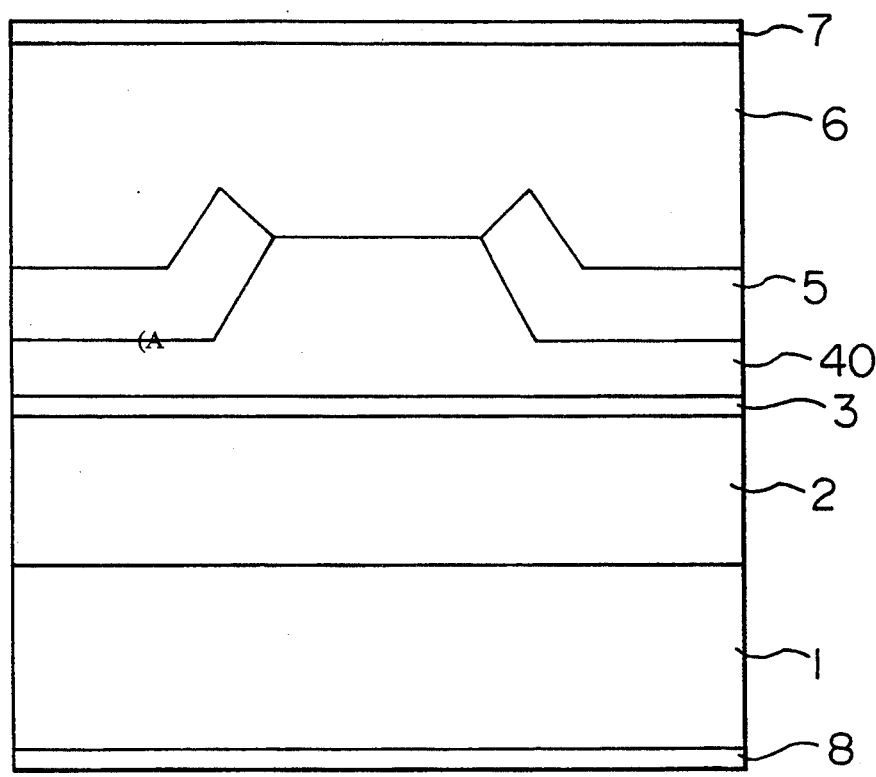
FIG. 3 is a cross-sectional view of the device structure of a conventional semiconductor laser.

FIG. 2 is a cross-sectional view of the device structure of a lateral mode control type semiconductor laser in accordance with a second embodiment of the present invention. As illustrated, the semiconductor laser has an n-GaAs substrate 1, an n-$(Al_{0.6}Ga_{0.4})_{0.5}In_{0.5}P$ clad layer 2 (1.0 μm), an undoped $Ga_{0.5}In_{0.5}P$ active layer 3 (60 nm), an undoped $(Al_{0.6}Ga_{0.4})_{0.5}In_{0.5}P$ layer 102 (5 nm), an undoped $Ga_{0.5}In_{0.5}P$ layer 103 (10 nm), a p-$(Al_{0.6}Ga_{0.4})_{0.5}In_{0.5}P$ clad layer 42 (1.0 μm), a p-GaAs contact layer 6 (3.0 μm), an n-GaAs current stricture layer 5 (0.5 mm), and p side and n side electrodes 7 and 8.

This device structure of the semiconductor laser was formed on a (100) n-GaAs substrate by a low pressure MOVPE method at a growing temperature of 750° C. and a growing pressure of 50 Torr, as described below. As raw-material gas, trimethyl gallium (TMG), trimethyl alminum (TMA), trimethyl indium (TMI), arsine ($AsH_3$), and phosphine ($PH_3$) are used. As dopant gas, hydrogen selenide $H_2Se$ and dimethylzinc (DMZ) are used.

In a first crystal growth step, n-$(Al_{0.6}Ga_{0.4})_{0.5}In_{0.5}P$ clad layer 2, undoped $Ga_{0.5}In_{0.5}P$ active layer 3, undoped $(Al_{0.6}Ga_{0.4})_{0.5}In_{0.5}P$ layer 102, undoped $Ga_{0.5}In_{0.5}P$ layer 103, p-$(Al_{0.6}Ga_{0.4})_{0.5}In_{0.5}P$ clad layer 42 and a p-GaAs cap layer (not shown) are successively laminated on n-GaAs substrate 1.

Next, p-$(Al_{0.6}Ga_{0.4})_{0.5}In_{0.5}P$ clad layer 42 is etched by using an $SiO_2$ mask (not shown) so that an unetched portion has a trapezoidal cross section, thereby forming a mesa stripe in the $<1\bar{1}0>$ direction. Thereafter, in a second crystal growth step, n-GaAs current stricture layer 5 is embedded in side surfaces of the mesa stripe by being selectively grown.

Next, the $SiO_2$ mask (not shown) is removed and, in a third crystal growth step, p-GaAs contact layer 6 is laminated over the entire surface. Finally, p side electrode 7 and n side electrode 8 are formed.

A semiconductor laser of the conventional semiconductor laser structure having no undoped $(Al_{0.6}Ga_{0.4})_{0.5}In_{0.5}P$ layer 102 and undoped $Ga_{0.5}In_{0.5}P$ layer 103 inserted was deteriorated in about 2,000 hours by operating with an oscillation wavelength of 676 nm in a 50° C., 5 mW continuous energization test. In contrast, stable operation for 10,000 hours or longer was confirmed with respect to the semiconductor laser of this embodiment operating with an oscillation wavelength of 680 nm in a 50° C., 5 mW continuous energization test.

A light emitting portion of the semiconductor laser of this embodiment was examined by SIMS analysis. A diffusion front of Zn, which is a p type impurity, was within the undoped $(Al_{0.6}Ga_{0.4})_{0.5}In_{0.5}P$ layer 102. A diffusion coefficient of Zn in the undoped $Ga_{0.5}In_{0.5}P$ layer 103 is sufficiently smaller than that in the p-$(Al_{0.6}Ga_{0.4})_{0.5}In_{0.5}P$ clad layer 42. Therefore, the undoped $Ga_{0.5}In_{0.5}P$ layer 103 can limit the diffusion sufficiently effectively although the thickness thereof is small, 10 nm. The second embodiment is equivalent to the first embodiment in terms of characteristics, but it is superior in terms of reproducibility. That is, in this embodiment, Zn diffused from the clad layer 42 is effectively trapped in the diffusion limit layers (102, 103), so that the diffusion front position is constant. The undoped $Ga_{0.5}In_{0.5}P$ layer 103 and the undoped $(Al_{0.6}Ga_{0.4})_{0.5}In_{0.5}P$ layer 102 serving as diffusion limit layers are sufficiently thin, 10 nm thick and 5 nm thick, respectively. Therefore, the influence of these layers upon the light intensity distribution is negligible.

In accordance with this embodiment, as described above, diffusion limit layers formed of the undoped $Ga_{0.5}In_{0.5}P$ layer 103 and the undoped $(Al_{0.6}Ga_{0.4})_{0.5}In_{0.5}P$ layer 102 having a diffusion coefficient smaller than that of the p-$(Al_{0.6}Ga_{0.4})_{0.5}In_{0.5}P$ clad layer 42 are provided between the clad layer 42 and the undoped $Ga_{0.5}In_{0.5}P$ active layer 3. Impurity Zn diffused from the p-$(Al_{0.6}Ga_{0.4})_{0.5}In_{0.5}P$ clad layer 42 during crystal growth or working is trapped in the undoped $Ga_{0.5}In_{0.5}P$ layer 103 almost entirely. A part of the impurity Zn diffuses in the undoped $(Al_{0.6}Ga_{0.4})_{0.5}In_{0.5}P$ layer 102 under the layer 103 but does not reach the undoped $Ga_{0.5}In_{0.5}P$ active layer 3. Therefore, there is no risk of a characteristic deterioration or a variation in oscillation wavelength caused by impurity diffusion in the undoped $Ga_{0.5}In_{0.5}P$ active layer 3, and it is possible to obtain a high-yield semiconductor laser having a long life and improved oscillation wavelength reproducibility.

A similar effect may be achieved by providing diffusion limit layers (102, 103) under the undoped $Ga_{0.5}In_{0.5}P$ active layer 3 (i.e., between the n-$(Al_{0.6}Ga_{0.4})_{0.5}In_{0.5}P$ clad layer 2 and the undoped $Ga_{0.5}In_{0.5}P$ active layer 3) instead of providing diffusion limit layers over the undoped $Ga_{0.5}In_{0.5}P$ active layer 3. If diffusion limit layers are provided over and under the active layer 3, a further improved effect can be achieved.

In the above-described first and second embodiments, a $Ga_{0.5}In_{0.5}P$ active layer is used as an active layer and an $(Al_{0.6}Ga_{0.4})_{0.5}In_{0.5}P$ clad layer is used as a clad layer, but these are not exclusive with respect to the composition and thickness. Any of clad and active layers expressed by $(Al_XGA_{1-X})InP$, and $(Al_YGa_{1-Y})InP$, respectively, and satisfying $0 \leq Y < X \leq 1$ may be used. While an n-GaAs substrate is used in the above-described embodiments, a p-GaAs substrate may be used. A quantum well structure may be used as an active layer structure.

What is claimed is:

1. A semiconductor laser having a double hetero structure, comprising:
    a GaAs substrate;
    a first lattice-adjusted $(Al_XGa_{1-X})InP$ clad layer formed on the substrate;
    an $(Al_YGa_{1-Y})InP$ active layer formed on the first lattice-adjusted clad layer with $(0 \leq Y < X \leq 1)$;
    a second lattice-adjusted $(Al_XGa_{1-X})InP$ clad layer formed on the active layer; and
    a low-doped $(Al_ZGa_{1-Z})InP$ layer interposed between the active layer and at least one of the clad layers with $0 \leq Y < Z \leq 1$, a carrier concentration in the low-doped layer being less than a carrier concentration in either of the first and second clad layers.

2. A semiconductor laser having a double hetero structure, comprising:
    a GaAs substrate;
    a first lattice-adjusted $(Al_XGa_{1-X})InP$ clad layer formed on the substrate;
    an $(Al_YGa_{1-Y})InP$ active layer formed on the first lattice-adjusted clad layer with $(0 \leq Y < X \leq 1)$;
    a second lattice-adjusted $(Al_XGa_{1-X})InP$ clad layer formed on the active layer; and
    a multi-layer diffusion limit layer interposed between the active layer and at least one of the clad layers, the multi-layer diffusion limit layer being formed from a plurality of sub-layers of $(Al_aGa_{1-a})InP$, $(Al_bGa_{1-b})InP, \ldots, (Al_nGa_{1-n})InP$ with $a < b < \ldots < n$, each of the sub-layers having a thickness not greater than 10 nm, at least one of the sub-layers having an impurity diffusion coefficient which is less than an impurity diffusion coefficient of either of the clad layers.

* * * * *